(12) United States Patent
Pohs

(10) Patent No.: US 9,797,582 B2
(45) Date of Patent: Oct. 24, 2017

(54) PRINTED CIRCUIT BOARD FOR A LAMP

(71) Applicant: ZUMTOBEL LIGHTING GMBH, Dornbirn (AT)

(72) Inventor: Mario Pohs, Dornbirn (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 108 days.

(21) Appl. No.: 14/770,024

(22) PCT Filed: Mar. 25, 2014

(86) PCT No.: PCT/AT2014/000053
§ 371 (c)(1),
(2) Date: Sep. 24, 2015

(87) PCT Pub. No.: WO2014/153579
PCT Pub. Date: Oct. 2, 2014

(65) Prior Publication Data
US 2016/0010834 A1 Jan. 14, 2016

(30) Foreign Application Priority Data

Mar. 28, 2013 (AT) .......................... GM102/2013 U
Apr. 25, 2013 (AT) .......................... GM142/2013 U

(51) Int. Cl.
H01L 33/00 (2010.01)
F21V 21/00 (2006.01)
H01L 27/15 (2006.01)
H01L 33/48 (2010.01)
F21S 8/02 (2006.01)
(Continued)

(52) U.S. Cl.
CPC ................ F21V 21/00 (2013.01); F21S 4/28 (2016.01); F21S 8/028 (2013.01); F21S 8/061 (2013.01); F21V 7/0016 (2013.01); F21V 23/005 (2013.01); F21V 23/02 (2013.01); H01L 27/153 (2013.01); H01L 27/156 (2013.01); H01L 33/483 (2013.01); H01L 33/486 (2013.01); F21V 13/04 (2013.01); F21Y 2200/00 (2015.01); F21Y 2105/10 (2016.08);
(Continued)

(58) Field of Classification Search
None
See application file for complete search history.

(56) References Cited

U.S. PATENT DOCUMENTS 6,483,439 B1 11/2002 Vukosic
2011/0193105 A1 8/2011 Lerman
2011/0235318 A1 9/2011 Simon

FOREIGN PATENT DOCUMENTS

CN 202769333 U 3/2013
DE 202004009717 U1 8/2004
(Continued)

Primary Examiner — Minh-Loan Tran
(74) Attorney, Agent, or Firm — Volpe and Koenig, P.C.

(57) ABSTRACT

The invention relates to a printed circuit board (9) for a lamp (1), having a plurality of circuit paths having a multiplicity of light-emitting diodes (8, 12), wherein the light-emitting diodes in a circuit path are each connected up in series with one another and the circuit paths are connected in parallel with one another, wherein a first number of light-emitting diodes (LD11, LD15, LD21, LD25, LD31 LD35, LD41, LD45, LD51, LD55, LD61, LD65) in a circuit path are fitted on a front of the printed circuit board and a second number of light-emitting diodes (LDi11, LDi31, LDi52) in the same circuit path are fitted on a back of the printed circuit board.

12 Claims, 2 Drawing Sheets

(51) Int. Cl.
*F21V 23/00* (2015.01)
*F21S 8/06* (2006.01)
*F21V 7/00* (2006.01)
*F21V 23/02* (2006.01)
*F21S 4/28* (2016.01)
*F21V 13/04* (2006.01)
*F21Y 105/12* (2016.01)
*F21Y 105/10* (2016.01)
*F21Y 107/90* (2016.01)
*H05K 1/18* (2006.01)
*F21Y 115/10* (2016.01)

(52) U.S. Cl.
CPC ....... *F21Y 2105/12* (2016.08); *F21Y 2107/90* (2016.08); *F21Y 2115/10* (2016.08); *H05K 1/18* (2013.01)

(56) References Cited

FOREIGN PATENT DOCUMENTS

| | | |
|---|---|---|
| DE | 202010008479 U1 | 12/2011 |
| WO | 2009089529 A1 | 7/2009 |
| WO | 2013021311 A2 | 2/2013 |

PRINTED CIRCUIT BOARD FOR A LAMP

FIELD OF THE INVENTION

The invention relates to a printed circuit board for a luminaire and to a luminaire comprising such a printed circuit board. At the present time, luminaires for general lighting more and more often are being equipped with light emitting diodes as illuminants. In order to be suitable for this purpose, a plurality of light emitting diodes interconnected in series with one another are used. Moreover, it is known, if necessary, for a plurality of circuit branches having light emitting diodes to be interconnected in parallel with one another.

BACKGROUND

Luminaires are often subject to the requirement that they can emit their light directly and indirectly. A luminaire emits its light directly if the light is emitted directly onto the surface to be illuminated and indirectly if the light is emitted in the direction of a reflective surface, that is to say usually a wall or ceiling, and is directed from there to the region that is actually to be illuminated. In this case, it is known from the prior art to provide separate light modules having light emitting diodes for the direct portion and for the indirect portion of the light. These modules are generally supplied by different operating devices or one portion of the parallel-connected circuit branches is provided for the indirect lighting, and the other portion of the circuit branches for the direct lighting. It is obvious that operating the light modules with different operating devices is costly in terms of wiring and with regard to the space requirement. Less obvious is the problem that arises if parallel-connected circuit branches are used for dividing the direct and indirect portions.

In order that a clearly defined current flows in the circuit branches, said current being a prerequisite for a uniform loading of the light emitting diodes, it is absolutely necessary to use exclusively light emitting diodes of the same voltage bin. Binning is understood to mean the sorting of light emitting diodes in accordance with graded parameters such as color temperature, brightness, forward voltage (voltage binning), etc. This is necessary in order to handle production-dictated deviations in the parameters of the light emitting diodes in such a way that they are not manifested disadvantageously during the operation of the light emitting diodes. Understandably binning leads to an additional logistical outlay.

If printed circuit boards for luminaires are equipped with light emitting diodes on both sides, i.e. on their front side and their rear side, a further problem arises. In the production process, in general, the front side is equipped with light emitting diodes in a first work step, and the rear side in a second work step. If the circuit branches having the light emitting diodes of the front side are in parallel with the light emitting diodes of the rear side, then, as explained above, this necessitates the use of light emitting diodes of the same voltage bin on the front and rear sides. In the production process, it must therefore be ensured that not all the light emitting diodes of a voltage bin are used up in equipping the first side.

The invention is based on the object of embodying a printed circuit board for luminaires in such a way that the abovementioned disadvantages particularly of binning are minimized. Moreover, the object is to enable a greater flexibility in the selection of the light emitting diodes.

SUMMARY

The object is achieved by means of a printed circuit board as set forth in the appended independent claim. According to the invention, a first number of light emitting diodes of a circuit branch are fitted on a front side of the printed circuit board and a second number of light emitting diodes of the same circuit branch are fitted on a rear side of the printed circuit board. Preferably, the light emitting diodes of a circuit branch are of the same type. However, the light emitting diodes of the front side can originate from a different voltage bin in comparison with the light emitting diodes of the rear side. If the printed circuit board is used in luminaires for general lighting, then light emitting diodes which emit white light are preferably used. Moreover, light emitting diodes of different designs can be used. By way of example, in one embodiment, it is possible to use the light emitting diodes of the front side as so-called 1-chip LEDs having a forward voltage of 3 volts and the light emitting diodes of the rear side with 2-chip LEDs with internal series interconnection of the chips. The combination of these light emitting diodes makes possible, besides the use of light emitting diodes from different voltage bins, a further degree of freedom in defining the proportions for direct and indirect light.

Advantageous configurations of the invention particularly with regard to the number and arrangement of the light emitting diodes are set forth in the dependent claims.

According to one development of the invention, it is provided that individual light emitting diodes or groups of light emitting diodes are bridgeable by means of zero-ohm resistors, wherein electrical contact areas for contacting the resistors are provided for this purpose on the printed circuit board. Particularly if the light emitting diodes of the rear side are bridged, a multiple utilization of the printed circuit board according to the invention is possible in a simple manner because a printed circuit board equipped on one side can also be employed in luminaire which emit light only directly. It should be noted here that the zero-ohm resistors are advantageously fitted on the front side if the light emitting diodes of the rear side are intended to be bridged (which in practice means that the latter are omitted) because only one side of the printed circuit board then need be equipped in the production process.

In a further configuration of the invention, first groups of light emitting diodes of circuit branches which have the same voltage potential are arranged in clusters for emitting their light into a common optical unit and second groups of light emitting diodes of circuit branches which have a voltage potential which differs from the voltage potential of the first group substantially by the forward voltage of a single light emitting diode used are arranged jointly with light emitting diodes of the first retained in clusters for emitting their light into a common optical unit. This arrangement of the light emitting diodes in clusters has the effect that in the case where a single one of the light emitting diodes exhibits a fault, light from the remaining light emitting diodes of the cluster is still emitted into the common optical unit and the basic function of the luminaire is thus.

Lenses, light guides or reflectors and combinations of these elements can be used as optical unit.

The invention also relates to a luminaire comprising at least one printed circuit board according to the invention. Particularly advantageously, the printed circuit boards according to the invention can be used in luminaires with direct and indirect light emission.

DETAILED DESCRIPTION OF THE PREFERRED EMBODIMENTS

Figure 1:
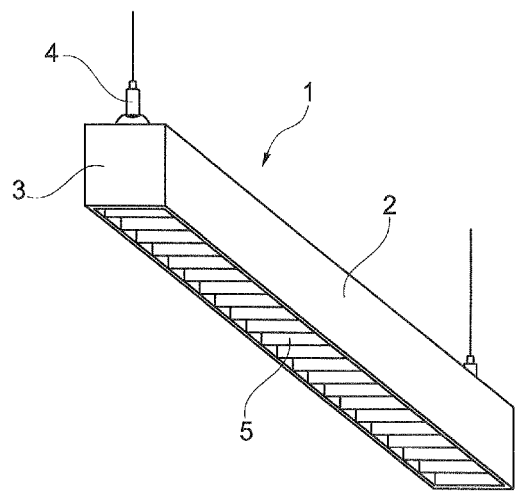
FIG. 1 shows a perspective view of a luminaire according to the invention.

FIG. 1 shows a luminaire (1) embodied as a pendant luminaire. The luminaire (1) comprises a housing having side walls (2) and end parts (3). Light is emitted from the luminaire (1) via a grid (5), which is embodied as a plastic cell grid. The luminaire (1) is mounted on a ceiling (not illustrated) by means of so-called cable pendants (4).

Figure 2:
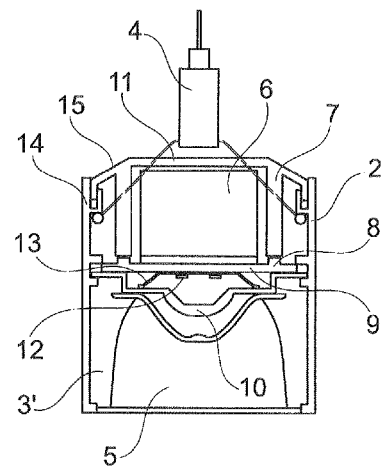
FIG. 2 shows the cross section through a luminaire according to the invention in accordance with FIG. 1.

FIG. 2 illustrates a luminaire (1) according to the invention in the embodiment in accordance with FIG. 1. It is evident that, besides the direct light emission via the grid (5), light is also emitted via the cover (11) to a ceiling (not illustrated). For this purpose, light emitting diodes (8) are arranged on a printed circuit board (9), said light emitting diodes being arranged in such a way that they radiate their light into light guides (7) arranged directly above them. This light is guided in the light guide (7) to the cover (11), from where it is emitted into the surroundings via an emission surface. The cover (11) together with the light guides (7) forms, as viewed in cross section, a U-shape composed of a crossbar and lateral flanks, wherein the cover (11) projects laterally beyond the light guides (7). As a result, projections (15) are formed which are arranged in an angular fashion relative to the plane in which the cover (11) lies. This angularity results in the advantageous effect that the emission of the light is expanded and, consequently, a larger region of the ceiling (not illustrated) is illuminated than would be the case if the angularity were not present. The cover (11) and also the light guides (7) or the crossbar, the lateral flanks and the projections (15), are embodied as a plastic profile and thus form a structural unit. This structural unit is connected as a whole to the side walls (2) of the luminaire housing. For this purpose, the structural unit has snap-action strips (14) at the end of the projections (15), said strips being respectively snapped into assigned first grooves of the side walls.

The printed circuit board (9) is equipped with light emitting diodes (8, 12) on both sides. The light emitting diodes (12) serving for direct lighting are covered by a lens profile (10), which, just as the printed circuit board (9) itself, are held in second grooves integrally formed on the side walls. The light emitted by the light emitting diodes (12) into the cell grid (5) via the lens profile (10) is deflected by said grid (5) in such a way that the luminaire (1) is provided with suppression of glare and fulfills the relevant standards for workspace lighting. In order to improve the efficiency, a reflector (13) is arranged laterally alongside the light emitting diodes (12), said reflector ensuring that as far as possible a large portion of the light of the light emitting diodes (12) is emitted in the direction of the lens profile (10).

Figure 3:
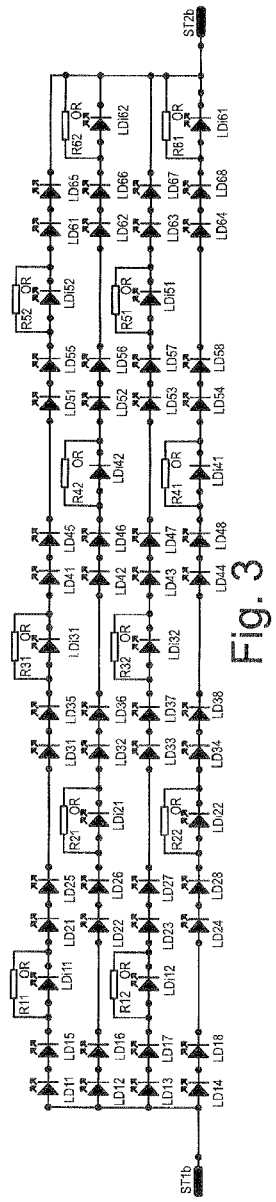
FIG. 3 shows a circuit diagram representing the electrical interconnection of the light emitting diodes on a printed circuit board according to the invention.
Figure 4:
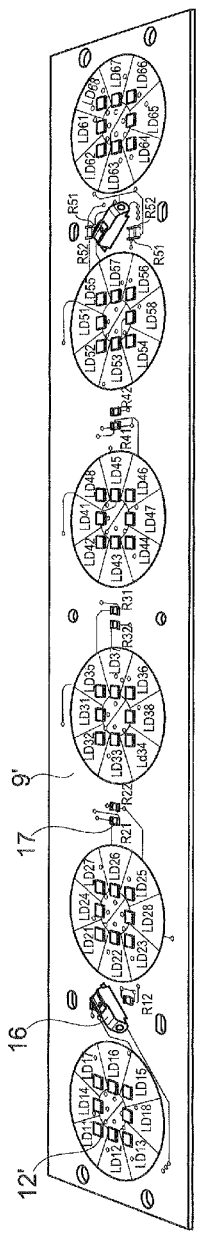
FIG. 4 shows the front view of a printed circuit board according to the invention.
Figure 5:
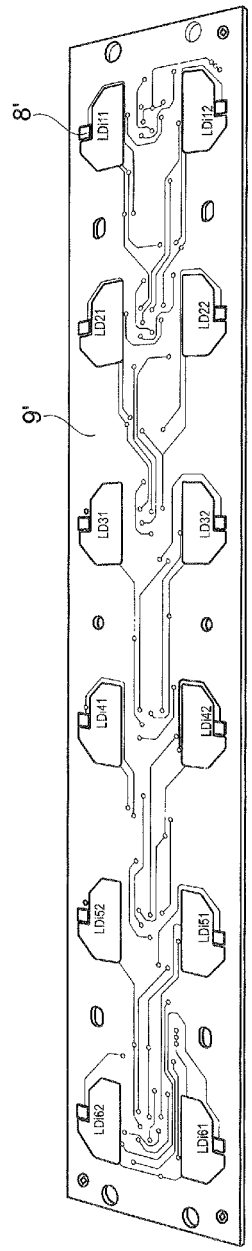
FIG. 5 shows the rear view of the printed circuit board according to the invention in accordance with FIG. 4.

The printed circuit board (9), illustrated only schematically in FIG. 2, and the light emitting diodes (8, 12), illustrated only schematically, are designated as printed circuit board (9') and as light emitting diodes (8', 12'), respectively, in FIGS. 3, 4 and 5. The light emitting diodes (12') of a circuit branch are arranged in series connection and have the designations LD11, LD15, LD21, LD25, LD31, LD35, LD41, LD45, LD51, LD55, LD61, LD65 and LDi11, LDi31, LDi52 in a first circuit branch. The light emitting diodes (12') having the designation LD11, LD15, LD21, LD25, LD31, LD35, LD41, LD45, LD51, LD55, LD61, LD65, which are fitted on the front side of the printed circuit board (9') illustrated in FIG. 4, serve for direct lighting and the light emitting diodes (8') having the designation LDi11, LDi31, LDi52, which are fitted on the rear side of the printed circuit board (9') illustrated in FIG. 5, serve for indirect lighting. For clarification, it should be noted that for reasons of clarity in this description and in the claims, in general, reference is only ever made to the light emitting diodes of the first circuit branch and the listing of the remaining light emitting diodes is omitted.

It is evident from FIG. 3 that four circuit branches each having fifteen light emitting diodes are interconnected in parallel with one another. In one preferred exemplary embodiment, a voltage of 40 to 46 volts (typically 43.7 volts, 12.2 watts) is applied to this circuit arrangement, which leads to a total current in the individual circuit branch of 70 milliamperes and of 280 milliamperes for the entire circuit arrangement in accordance with FIG. 3. For a luminaire of the type in FIG. 1, preferably four printed circuit boards having a circuit arrangement in accordance with FIG. 3 are used, wherein the printed circuit boards are connected in series. A converter which supplies an output voltage of 160-184 volts and a constant current of 280 milliamperes (that typically corresponds to 49 watts) can therefore be used for operating this circuit arrangement.

For understanding the circuit, it should also be noted that the zero-ohm resistors having the designation R11, R31, R52 are not fitted if the light emitting diodes LDi11, LDi31, LDi52 are fitted, and vice versa.

FIG. 4 generally shows, in a perspective illustration, the front side of a printed circuit board according to the invention. A total of six clusters each having eight light emitting diodes arranged in a square pattern are positioned on the printed circuit board (9'). The light emitting diodes LD11 to LD18 shall be mentioned by way of example, these light emitting diodes forming a first cluster having eight light emitting diodes.

As is evident from the circuit diagram in accordance with FIG. 3 in conjunction with FIG. 4, in a first section of the printed circuit board (9') in each case two light emitting diodes, namely LD11 with LD15, LD12 with LD16, LD13 with LD17 and LD14 with LD18 are connected in series with one another and in this way form a group of two light emitting diodes. This series connection of two light emitting diodes is in each case at the same voltage potential since each of these groups is situated in one of the four circuit branches connected in parallel.

The square arrangement of the light emitting diodes in the clusters mentioned above now makes it possible to provide an optical unit in front of and/or alongside the light emitting diodes, the optical unit takes up all light emitted by the light emitting diodes and guides or directs said light in accordance with its optical properties. By way of example, FIG. 2 shows such an optical unit realized by a reflector (13) and a lens optical unit (10), wherein a reflector (5) attached in front additionally improves the light technology further. Instead of a square arrangement of the light emitting diodes forming a cluster, other, in particular geometrical, patterns such as, for example, circles, hexagons and so on are also conceivable.

In each case two light emitting diodes, namely LD21 with LD25, LD22 with LD26, LD23 with LD27 and LD24 with LD28, of the second cluster are connected in series with one another, although only the light emitting diodes LD21 with LD25 and LD23 with LD27 are at the same voltage potential, since the voltage potential of the light emitting diodes LD22 with LD26 and LD24 with LD28 differs from the abovementioned groups of light emitting diodes by virtue of the voltage drop caused by the light emitting diodes LDi11 and LDi12, respectively. With regard to the spatial arrangement or with regard to the arrangement as a pattern, however, the second cluster of light emitting diodes does not differ from the first cluster.

Furthermore, an input terminal (16) and an output terminal are arranged on the printed circuit board (9'). The zero-ohm resistors (17) are additionally illustrated, wherein it is pointed out again that the printed circuit board (9') is equipped with said resistors only if no light emitting diodes are arranged on the rear side of the printed circuit board (9') and the printed circuit board is accordingly provided for use in a luminaire purely with direct lighting.

FIG. 5 shows the rear side of the printed circuit board (9') in perspective illustration. A total of twelve light emitting diodes (8') are arranged in two rows along lateral edge regions of the printed circuit board (9'). The spatial distribution of said light emitting diodes (8') on the printed circuit board (9') is effected in such a way that only light emitting diodes which are not arranged in the same circuit branch lie alongside one another. The failure of individual light emitting diodes has less of a disturbing effect as a result.

The invention claimed is:

1. A printed circuit board for a luminaire, comprising a plurality of circuit branches having a multiplicity of light emitting diodes, wherein the light emitting diodes of a circuit branch are in each case interconnected in series with one another and the circuit branches are connected in parallel with one another, wherein
   a first number of light emitting diodes (LD11, LD15, LD21, LD25, LD31, LD35, LD41, LD45, LD51, LD55, LD61, LD65) of a circuit branch are fitted on a front side of the printed circuit board and a second number of light emitting diodes (LDi11, LDi31, LDi52) of the same circuit branch are fitted on a rear side of the printed circuit board;
and wherein the light emitting diodes (LD11, LD15, LD21, LD25, LD31, LD35, LD41, LD45, LD51, LD55, LD61, LD65) of a circuit branch are of the same type, wherein the light emitting diodes (LD11, LD15, LD21, LD25, LD31, LD35, LD41, LD45, LD51 LD55, LD61, LD65) of the first number have a different voltage bin than the light emitting diodes (LDi11, LDi31, LDi52) of the second number.

2. The printed circuit board as claimed in claim 1, wherein the number of light emitting diodes (LD11, LD15, LD21, LD25, LD31, LD35, LD41, LD45, LD51, LD55, LD61, LD65) which are fitted on the front side of the printed circuit board is not equal to the number of light emitting diodes (LDi11, LDi31, LDi52) which are fitted on the rear side.

3. The printed circuit board as claimed in claim 2, wherein the number of light emitting diodes (LD11, LD15, LD21, LD25, LD31, LD35, LD41, LD45, LD51, LD55, LD61, LD65) which are fitted on the front side of the printed circuit board is greater than the number of light emitting diodes (LDi11, LDi31, LDi52) which are fitted on the rear side.

4. The printed circuit board as claimed in claim 1, wherein the ratio of the number of light emitting diodes (LD11, LD15, LD21, LD25, LD31, LD35, LD41, LD45, LD51, LD55, LD61, LD65) which are fitted on the front side of the printed circuit board to the number of light emitting diodes (LDi11, LDi31, LDi52) which are fitted on the rear side is 4:1.

5. The printed circuit board as claimed in claim 1, wherein the light emitting diodes (LD11, LD15, LD21, LD25, LD31, LD35, LD41, LD45, LD51, LD55, LD61, LD65; LDi11, LDi31, LDi52) emit white light.

6. A printed circuit board for a luminaire, comprising a plurality of circuit branches having a multiplicity of light emitting diodes, wherein the light emitting diodes of a circuit branch are in each case interconnected in series with one another and the circuit branches are connected in parallel with one another, wherein
   a first number of light emitting diodes (LD11, LD15, LD21, LD25, LD31, LD35, LD41, LD45, LD51, LD55, LD61, LD65) of a circuit branch are fitted on a front side of the printed circuit board and
   a second number of light emitting diodes (LDi11, LDi31, LDi52) of the same circuit branch are fitted on a rear side of the printed circuit board and wherein within a circuit branch a light emitting diode of the front side or a group of light emitting diodes (LD11, LD15, LD21, LD25, LD31, LD35, LD41, LD45, LD51, LD55, LD61, LD65) of the front side is arranged alternately with a light emitting diode (LDi11, LDi31, LDi52) of the rear side or a group of light emitting diodes of the rear side.

7. The printed circuit board as claimed in claim 6, wherein individual light emitting diodes (LDi11, LDi31, LDi52) or groups of light emitting diodes can be bridged by means of zero-ohm resistors (R11, R31, R52), wherein electrical contact areas for contacting the resistors (R11, R31, R52) are provided for this purpose on the printed circuit board.

8. A printed circuit board for a luminaire, comprising a plurality of circuit branches having a multiplicity of light emitting diodes, wherein the light emitting diodes of a circuit branch are in each case interconnected in series with one another and the circuit branches are connected in parallel with one another, wherein
   a first number of light emitting diodes (LD11, LD15, LD21, LD25, LD31, LD35, LD41, LD45, LD51, LD55, LD61, LD65) of a circuit branch are fitted on a front side of the printed circuit board and
   a second number of light emitting diodes (LDi11, LDi31, LDi52) of the same circuit branch are fitted on a rear side of the printed circuit board and wherein a first group of light emitting diodes (LD11-LD18; LD21, LD25, LD23, LD24) of circuit branches (1, 2, 3, 4) which have the same voltage potential are arranged in clusters for emitting their light into a common optical unit.

9. The printed circuit board as claimed in claim 8, wherein a second group of light emitting diodes (LD22, LD26, LD24, LD28) of circuit branches which have a voltage potential which differs from the voltage potential of the first group (LD21, LD25, LD23, LD24) substantially by the forward voltage of the light emitting diodes used are arranged jointly with light emitting diodes of the first group (LD21, LD25, LD23, LD24) in clusters for emitting their light into a common optical unit.

10. A luminaire comprising at least one printed circuit board the at least one printed circuit board comprising a plurality of circuit branches having a multiplicity of light emitting diodes, wherein the light emitting diodes of a circuit branch are in each case interconnected in series with one another and the circuit branches are connected in parallel with one another, wherein
  a first number of light emitting diodes (LD11, LD15, LD21, LD25, LD31, LD35, LD41, LD45, LD51, LD55, LD61, LD65) of a circuit branch are fitted on a front side of the printed circuit board and
  a second number of light emitting diodes (LDi11, LDi31, LDi52) of the same circuit branch are fitted on a rear side of the printed circuit board and wherein the light emitting diodes (LD11, LD15, LD21, LD25, LD31, LD35, LD41, LD45, LD51, LD55, LD61, LD65) of a circuit branch are of the same type, wherein the light emitting diodes (LD11, LD15, LD21, LD25, LD31, LD35, LD41, LD45, LD51 LD55, LD61, LD65) of the first number have a different voltage bin than the light emitting diodes (LDi11, LDi31, LDi52) of the second number.

11. The luminaire as claimed in claim 10, wherein the luminaire is embodied as a surface-mounted or pendant luminaire, wherein the light of the first number of light emitting diodes (LD11, LD15, LD21, LD25, LD31, LD35, LD41, LD45, LD51, LD55, LD61, LD65) serves for direct lighting and the light of the second number of light emitting diodes (LDi11, LDi31, LDi52) serves for indirect lighting.

12. A luminaire comprising at least one printed circuit board the at least one printed circuit board comprising a plurality of circuit branches having a multiplicity of light emitting diodes, wherein the light emitting diodes of a circuit branch are in each case interconnected in series with one another and the circuit branches are connected in parallel with one another, wherein
  a first number of light emitting diodes (LD11, LD15, LD21, LD25, LD31, LD35, LD41, LD45, LD51, LD55, LD61, LD65) of a circuit branch are fitted on a front side of the printed circuit board and
  a second number of light emitting diodes (LDi11, LDi31, LDi52) of the same circuit branch are fitted on a rear side of the printed circuit board and wherein within a circuit branch a light emitting diode of the front side or a group of light emitting diodes (LD11, LD15, LD21, LD25, LD31, LD35, LD41, LD45, LD51, LD55, LD61, LD65) of the front side is arranged alternately with a light emitting diode (LDi11, LDi31, LDi52) of the rear side or a group of light emitting diodes of the rear side.

* * * * *